(12) United States Patent
Carpineto

(10) Patent No.: US 6,785,528 B2
(45) Date of Patent: Aug. 31, 2004

(54) QUADRATURE DIVIDER

(75) Inventor: Lorenzo Maria Carpineto, Antibes (FR)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/264,703

(22) Filed: Oct. 4, 2002

(65) Prior Publication Data

US 2003/0190905 A1 Oct. 9, 2003

(30) Foreign Application Priority Data

Apr. 4, 2002 (EP) .......................................... 02290840

(51) Int. Cl.[7] ................................................ H04B 1/00
(52) U.S. Cl. ...................... 455/323; 455/313; 455/118; 375/298
(58) Field of Search ............................... 455/326, 323, 455/302, 324, 118, 313; 375/295, 298

(56) References Cited

U.S. PATENT DOCUMENTS

| | | | | | |
|---|---|---|---|---|---|
| 4,670,674 | A | * | 6/1987 | Kantorowicz et al. | 327/118 |
| 5,387,883 | A | * | 2/1995 | Ueda | 332/103 |
| 5,400,363 | A | * | 3/1995 | Waugh et al. | 375/324 |
| 5,926,750 | A | * | 7/1999 | Ishii | 455/130 |
| 6,194,947 | B1 | * | 2/2001 | Lee et al. | 327/359 |
| 6,369,633 | B1 | * | 4/2002 | Tsukahara | 327/254 |
| 6,560,297 | B1 | * | 5/2003 | Broughton | 375/308 |
| 6,560,449 | B1 | * | 5/2003 | Liu | 455/302 |

FOREIGN PATENT DOCUMENTS

| | | | |
|---|---|---|---|
| EP | 0 797 292 A | 9/1997 | |
| EP | 0 948 129 A | 10/1999 | |
| GB | 2 130 826 A | 6/1984 | |
| JP | 2000-253815 * | 8/2000 | ........... H03B/19/00 |
| JP | 2002-76777 A * | 3/2002 | |

OTHER PUBLICATIONS

Ferre–Pikal, et al., "Microwave Regenerative Dividers With Low Phase Noise", Microwave Symposium Digest, !998 IEEE MTT–S International, Jun. 1998, vol. 3, pp. 1447–1450.*

Ferre–Pikal et al., "Low PM noise Regenerative Dividers", Frequency Control Symposium, 1997., Proceeding 1997 IEEE International, May 1997, pp. 478–484.*

"Microwave Regenerative Dividers with Low Phase Noise", Ferre–Pikal ES et al., Microwave Symposium Digest, 1998 IEEE MTT–S Digest International, Baltimore, MD, USA Jun. 7–12, 1998, New York NY, IEE, US, pp. 1447–1450.

* cited by examiner

*Primary Examiner*—Charles Appiah
(74) *Attorney, Agent, or Firm*—Ronald O. Neerings; Wade James Brady, III; Frederick J. Telecky, Jr.

(57) ABSTRACT

A quadrature divider includes a first analog mixer (20, 30) for receiving a digital input signal at a predetermined frequency at a first input of the mixer and a second analog mixer (24, 32) for receiving the input signal with a 180° phase shift at a first input of the mixer. The output of the first mixer is coupled to a second input of the first mixer and an output of the second mixer is coupled to a second input of the second mixer.

18 Claims, 2 Drawing Sheets

*FIG. 1a*
*(PRIOR ART)*
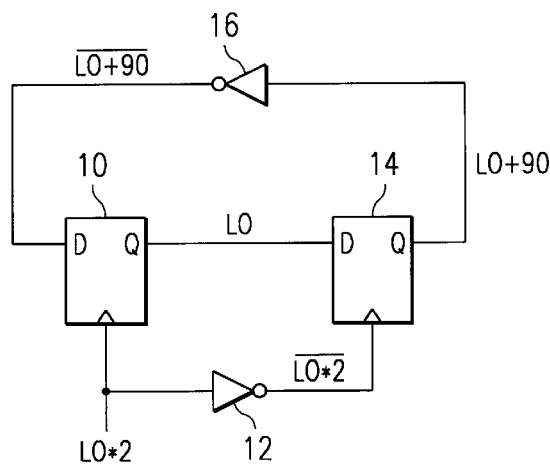
*FIG. 1b*
*(PRIOR ART)*
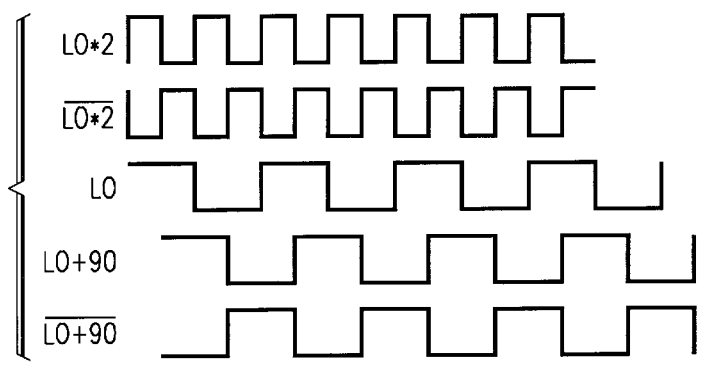
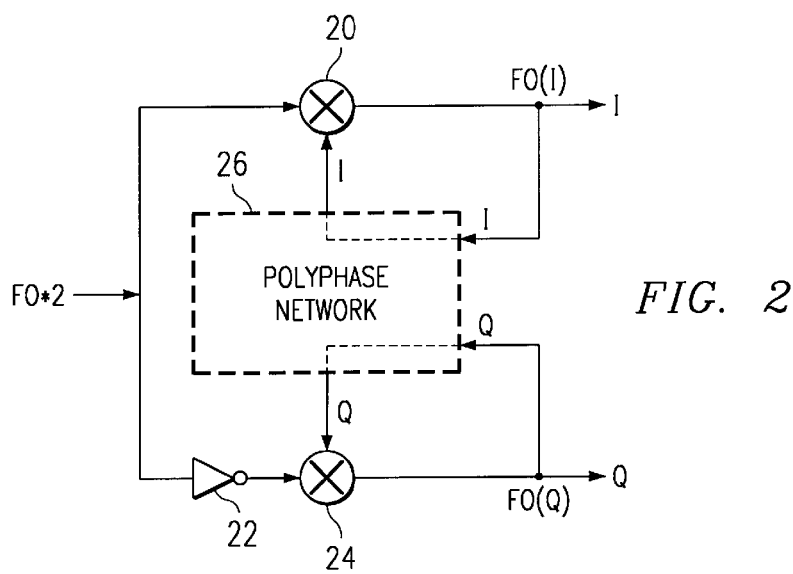
*FIG. 2*

QUADRATURE DIVIDER

CROSS-REFERENCE TO RELATED APPLICATIONS

Not Applicable

STATEMENT OF FEDERALLY SPONSORED RESEARCH OR DEVELOPMENT

Not Applicable

BACKGROUND OF THE INVENTION

1. Technical Field

This invention relates in general to electronic communication devices and, more particularly, to a circuit for providing a divided quadrature signal.

2. Description of the Related Art

Wireless communications devices are continuously being updated for smaller size, greater battery life and lower cost. One important factor in achieving these goals is greater integration of the electronics used in a wireless communications device. In many devices, such as mobile phones, it is envisioned that the entire electronics will be integrated onto a single chip in the near future.

In order to achieve the highest possible level of integration, a homodyne transmitter design may be used. One of the major issues with this design is on-chip generation of quadrature signals from the transmit VCO (voltage controlled oscillator). The quadrature signals should have a very low close in phase noise as well as a very low noise floor, on the order of −165 dBc at a 20 MHz offset. By dividing the signal frequency in two, a 6 dB gain in close-in phase noise can be obtained. Presently, signal division is generally performed using latches to divide the signal and generate quadrature signals. Unfortunately, in using latches to produce the quadrature signals, a noise floor of −145 dBc is about the best that can be achieved.

Therefore, a need has arisen for a low-noise solution for generating a divided quadrature signal.

BRIEF SUMMARY OF THE INVENTION

In the present invention, a quadrature divider includes a first analog mixer for receiving a digital input signal at a predetermined frequency at a first input of the first mixer and a second analog mixer for receiving the input signal with a 180° phase shift at a first input of the second mixer. The output of the first mixer is coupled to a second input of the first mixer and an output of the second mixer is coupled to a second input of the second mixer.

The present invention provides significant advantages over the prior art. A quadrature signal at one-half of the input frequency is obtained, without the noise associated with the use of latches to obtain the divided signal. In a differential embodiment, the 180° phase shift between inputs to the mixers can be obtained by a polarity inversion at the inputs to one of the mixers, thereby eliminating any unwanted delays associated with the phase shift.

BRIEF DESCRIPTION OF THE SEVERAL VIEWS OF THE DRAWINGS

For a more complete understanding of the present invention, and the advantages thereof, reference is now made to the following descriptions taken in conjunction with the accompanying drawings, in which:

FIG. 1a is a block diagram of a prior art quadrature divider;

FIG. 1b illustrates a timing diagram showing the operation of FIG. 1a;

FIG. 2 illustrates a block diagram of a first embodiment of a quadrature divider;

DETAILED DESCRIPTION OF THE INVENTION

Figure 3:
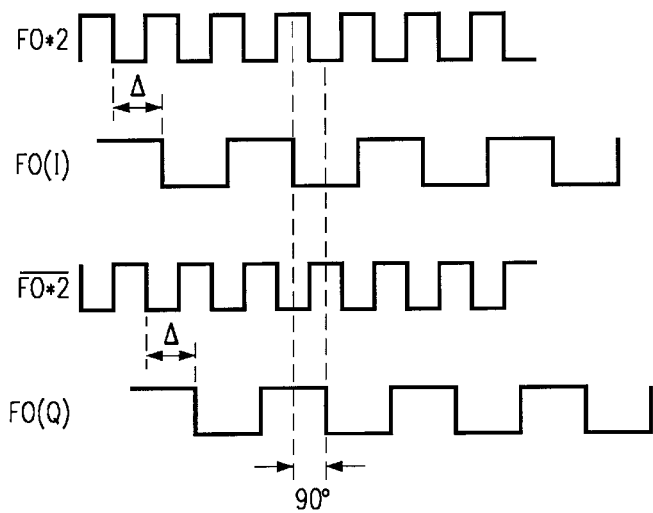
FIG. 3 illustrates a timing diagram showing the operation of FIG. 2.

The present invention is best understood in relation to FIGS. 1–5 of the drawings, like numerals being used for like elements of the various drawings.

FIG. 1a illustrates a block diagram of the prior art solution for producing a divided quadrature signal. The input signal is LO*2 has a frequency two times the local oscillator frequency. The input signal LO*2 clocks a first latch 10 and is also input to inverter 12. The output of inverter 12 clocks a second latch 14. The Q (non-inverting) output of latch 10 is coupled to the input of latch 14. The Q output of latch 14 is input to inverter 16. The output of inverter 16 is coupled to the input of latch 10.

FIG. 1b is a timing diagram illustrating the operation of FIG. 1a. The output of inverter 12 ($\overline{LO*2}$) has a 180° phase shift from the LO*2 signal. The output of latch 10 is LO. The output of latch 12 is LO+90°; hence the outputs of latches 10 and 14 provide a quadrature signal that is one-half of the input signal (LO*2).

Unfortunately, the circuit shown in FIGS. 1a and 1b has significant problems that limit its usefulness in an integrated transmit receiver design. First, the inverters 12 and 16 introduce phase errors and the latches 10 and 14 introduce excessive noise. Using this design, a noise floor of only −145 dBc can be achieved.

FIG. 2 illustrates a first embodiment for quadrature frequency dividers that overcomes the limitations of the prior art. In FIG. 2, a digital input clock signal having frequency FO*2 is input to a first input of mixer 20 and to an inverter 22. The output of inverter 22 is coupled to a first input of mixer 24. The output of mixer 20 (FO(I), the I component of the divided signal) and mixer 24 (FO(Q), the Q component of the divided signal) are coupled to a polyphase network filter 26 (optional). The FO(I) signal is returned to the second input of mixer 20 and the FO(Q) output is returned to the second input of mixer 24.

In operation, mixers 20 and 24 each perform the function of analog dividers. The principle of the mixers functioning as dividers is the following: the incoming signal at FO*2 is mixed with the mixer output that can be any harmonic in the form of FO*2·N/M, where N and M are two integers. It is easy to achieve N/M=½, in which case the output signal will have a frequency one half of the input frequency (FO). In steady state, the output frequency will be FO*2−FO=FO. Since the input to mixer 24 is phase shifted by 180°, the resultant phase shift in the outputs of the mixers will be 90°.

A timing diagram is shown in FIG. 3. At steady state, the mixer output frequency is in a fixed phase relationship with the input frequencies, depending upon internal mixer delay, Δ. If the mixer delays are perfectly matched, and if the input frequency ($\overline{FO*2}$) of mixer 24 is 180° offset from the input frequency of mixer 20 (FO*2), then the output frequencies of the two mixers must have the same phase relationship, so the output frequency will be shifted by 90°.

The mixers 20 and 24 can use any of a number of standard mixer designs for integration in a semiconductor die, such as a Gilbert cell or similar design. Using modern semiconductor fabrication techniques, the components of each mixer can be closely matched, such that the internal mixer delay will be the same for each. The optional polyphase network filter 26, however, can be used to maintain an exact 90° phase shift between the output signals returned to each mixer.

Figure 4:
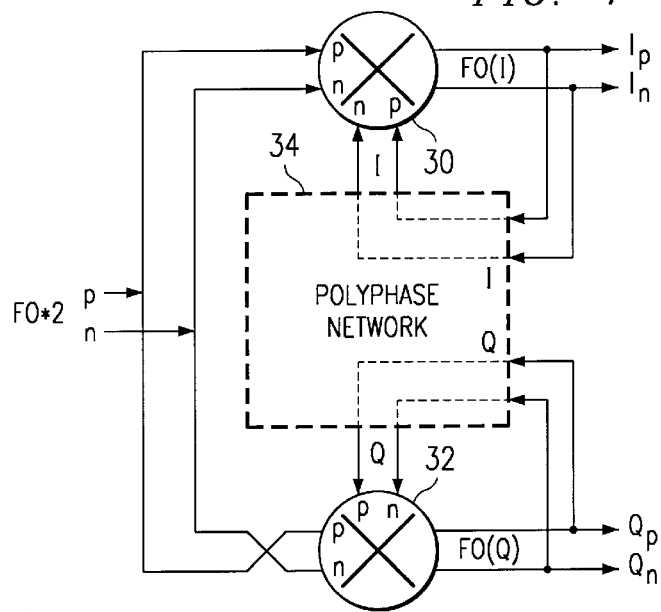
FIG. 4 illustrates a second embodiment of a quadrature divider.

FIG. 4 illustrates a second embodiment of the quadrature divider, where a differential implementation in illustrated. In this embodiment, the input signal is a differential signal with frequency FO*2. The nodes of the differential input signal are designated "p" and "n" for reference regarding the polarity of the differential signal. The input signal is coupled to differential mixers 30 and 32; however, the nodes of the differential signal are inverted at the input of mixer 32. Accordingly, the input signal is 180° phase-shifted relative to the signal at the input of mixer 30. The outputs of each mixer are coupled to differential polyphase network filter 34, which is optionally used to maintain a 90° phase shift between the two signals. The I and Q outputs, after phase adjustments from polyphase network filter 34 are coupled to the second differential inputs of mixers 30 and 32 respectively.

The operation is the same as that described with in connection with FIGS. 2 and 3, with the exception that differential signals are used. A differential mixer design, such as a differential Gilbert cell with differential inputs can be used to realize the mixers.

This embodiment of the quadrature divider provides the advantage that the inverter used in FIG. 2 is eliminated, along with the delay and noise associated with the inverter. Accordingly, any phase deviation from the 90° offset is therefore due to mismatches in the delays through the inverters, which should be minimal. Any such delay mismatch, however, can be corrected using the polyphase network filter 34.

Figure 5:
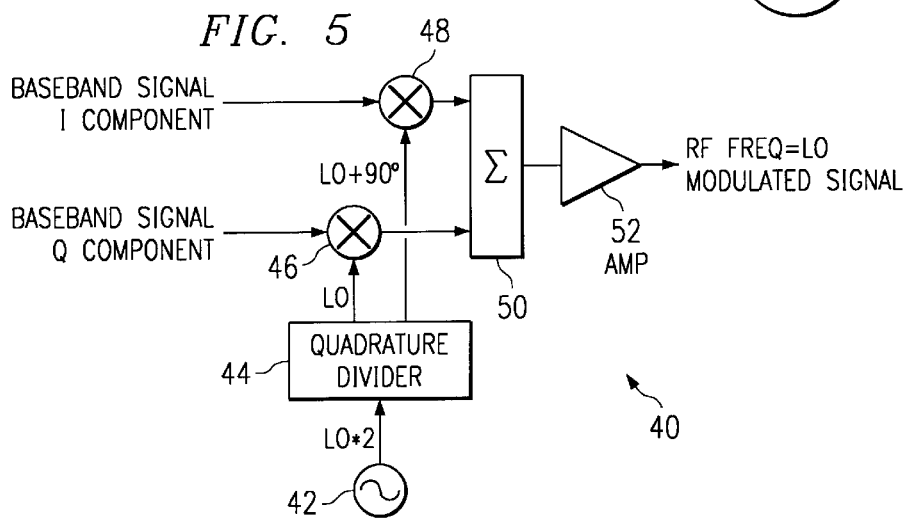
FIG. 5 illustrates a block diagram of a transmit receiver using the quadrature divider of FIG. 2 or FIG. 4.

FIG. 5 illustrates a block diagram of a homodyne transmitter 40. A local oscillator 42 generates a signal with a frequency of LO*2. The output of local oscillator 42 is received by quadrature divider 44, shown in FIGS. 2 and 4. The quadrature divider output a first signal at frequency LO to mixer 46 and a second signal at frequency LO and offset by 90° to mixer 48 (alternatively, the LO signal could be coupled to mixer 48 and the LO+90° signal could be coupled to mixer 46). Mixer 46 also receives the Q component of the baseband signal and mixer 48 receives the I component of the baseband signal. The outputs of mixers 46 and 48 are summed at summing stage 50. The output of summing stage 50 is received by amplifier 52. The output of amplifier 52 is the modulated signal around a radio frequency of LO.

The present invention provides significant advantages over the prior art. A quadrature signal at one-half of the input frequency is obtained, without the noise associated with the use of latches to obtain the divided signal. In the differential embodiment, a symmetrical circuit is provided, where the paths of the input signals, phase-shifted by 180°, is identical. Because of the reduction of noise associated with the quadrature divider, a homodyne transmitter can be implemented without an extra noise shaping filter for telecommunication standards that require very low noise floor. This leads to cost, area and power reduction with respect to a noisier divider. Moreover the use of a VCO with twice the frequency of the transmit VCO will reduce coupling between the two devices.

Although the Detailed Description of the invention has been directed to certain exemplary embodiments, various modifications of these embodiments, as well as alternative embodiments, will be suggested to those skilled in the art. The invention encompasses any modifications or alternative embodiments that fall within the scope of the claims.

What is claimed is:

1. A quadrature divider comprising:
    a first analog mixer receiving a digital input signal at a predetermined frequency at a first input of said mixer;
    a second analog mixer receiving said input signal with a 180° phase shift at a first input of said mixer;
    wherein an output of said first mixer is coupled to a second input of said first mixer and an output of said second mixer is coupled to a second input of said second mixer.

2. The quadrature divider of claim 1 and further comprising an inverter coupled to the input of said second mixer to perform said 180° phase shift of said input signal.

3. The quadrature divider of claim 1 and further comprising a polyphase network filter for maintaining a 90° phase shift between the output of said first mixer and the output of said second mixer.

4. The quadrature divider of claim 1 wherein said first and second mixers are differential analog mixers.

5. A quadrature divider comprising:
    a first differential analog mixer receiving a digital input signal at a predetermined frequency at a first input of said mixer;
    a second differential analog mixer receiving said input signal with a 180° phase shift at a first input of said mixer;
    wherein an output of said first mixer is coupled to a second input of said first mixer and an output of said second mixer is coupled to a second input of said second mixer and
    wherein said input signal is coupled to said first mixer with a first polarity orientation and said input signal is coupled to said second mixer with a second polarity orientation, such that the inputs to said first and second mixers are shifted by 180° to one another.

6. The quadrature divider of claim 5 and further comprising a differential polyphase network filter for maintaining a 90° phase shift between the output of said first mixer and the output of said second mixer.

7. A transmitter comprising:
    an oscillator for generating a first signal of known frequency
    a quadrature divider for dividing the frequency of said first signal and generating a first quadrature signal associated with said first signal, comprising:
        a first analog mixer receiving said first signal at a predetermined frequency at a first input of said mixer;
        a second analog mixer receiving said first signal with a 180° phase shift at a first input of said mixer;
        wherein an output of said first mixer is coupled to a second input of said first mixer and an output of said second mixer is coupled to a second input of said second mixer; and
    circuitry for mixing said quadrature signal from said quadrature divider with a second quadrature signal.

8. The transmitter of claim 7 wherein said quadrature divider further comprises an inverter coupled to the input of said second mixer to perform a 180° phase shift of said first signal.

9. The transmitter of claim 7 wherein said quadrature divider further comprises a polyphase network filter for maintaining a 90° phase shift between the output of said first mixer and the output of said second mixer.

10. The transmitter of claim 7 wherein said first and second mixers are differential analog mixers.

11. The transmitter of claim 10 wherein said first signal is coupled to said first mixer with a first polarity orientation and said first signal is coupled to said second mixer with a second polarity orientation, such that the inputs to said first and second mixers are shifted by 180° relative to one another.

12. The transmitter of claim 11 and further comprising a differential polyphase network filter for maintaining a 90° phase shift between the output of said first mixer and the output of said second mixer.

13. A method of generating a divided quadrature signal from a digital input signal at a predetermined frequency, comprising the steps of:

receiving said input signal at a first input of a first analog mixer;

receiving said input signal with a 180° phase shift at a first input of a second analog mixer;

wherein an output of said first mixer is coupled to a second input of said first mixer and an output of said second mixer is coupled to a second input of said second mixer.

14. The method of claim 13 and further comprising the step of inverting said input signal with an inverter to perform a 180° phase shift of said input signal.

15. The method of claim 13 and further comprising maintaining a 90° phase shift between the output of said first mixer and the output of said second mixer with a polyphase network filter.

16. The method of claim 13 wherein said input signal is a differential input signal.

17. A method of generating a divided quadrature signal from a digital differential input signal at a predetermined frequency, comprising the steps of:

receiving said differential input signal at a first input of a first analog mixer;

receiving said differential input signal with a 180° phase shift at a first input of a second analog mixer; and wherein an output of said first mixer is coupled to a second input of said first mixer and an output of said second mixer is coupled to a second input of said second mixer and wherein said step of receiving said differential input signal at said first input of said first mixer comprises the step of receiving said differential input signal with a first polarity at said first input of said first mixer and said step of receiving said differential input signal at said first input of said second mixer comprises the step of receiving said differential input signal with an opposite polarity at said first input of said second mixer, such that the inputs to said first and second mixers are shifted by 180° to one another.

18. The method of claim 17 and further comprising maintaining a 90° phase shift between the output of said first mixer and the output of said second mixer with a differential polyphase network filter.

* * * * *